United States Patent
Richards et al.

(10) Patent No.: US 7,064,541 B2
(45) Date of Patent: Jun. 20, 2006

(54) COMPLEMENTARY METAL-OXIDE SEMICONDUCTOR XYLOPHONE BAR MAGNETOMETER WITH AUTOMATIC RESONANCE CONTROL

(75) Inventors: Eli A. Richards, Catonsville, MD (US); Dennis K. Wickenden, Woodbine, MD (US)

(73) Assignee: The Johns Hopkins University, Baltimore, MD (US)

( * ) Notice: Subject to any disclaimer, the term of this patent is extended or adjusted under 35 U.S.C. 154(b) by 50 days.

(21) Appl. No.: 10/896,453

(22) Filed: Jul. 22, 2004

(65) Prior Publication Data

US 2005/0030115 A1 Feb. 10, 2005

Related U.S. Application Data

(60) Provisional application No. 60/492,942, filed on Aug. 6, 2003.

(51) Int. Cl.
*G01R 33/00* (2006.01)
*H03B 5/30* (2006.01)

(52) U.S. Cl. ........................ 324/244; 331/154
(58) Field of Classification Search ............... 324/244; 331/154

See application file for complete search history.

(56) References Cited

U.S. PATENT DOCUMENTS

| | | | |
|---|---|---|---|
| 4,901,586 A | 2/1990 | Blake et al. | |
| 5,456,111 A | 10/1995 | Hulsing | |
| 5,959,452 A | 9/1999 | Givens et al. | |
| 6,351,891 B1 | 3/2002 | MacGugan | |
| 6,495,019 B1 | 12/2002 | Filas et al. | |
| 6,499,545 B1 | 12/2002 | MacGugan | |
| 6,624,498 B1 | 9/2003 | Filas et al. | |
| 6,653,831 B1 | 11/2003 | Friend et al. | |
| 6,664,786 B1 | 12/2003 | Kretschmann et al. | |
| 6,819,103 B1* | 11/2004 | Champion et al. | 324/260 |
| 2001/0035750 A1 | 11/2001 | Murphy | |

* cited by examiner

Primary Examiner—Bot LeDynh
(74) Attorney, Agent, or Firm—Francis A. Cooch

(57) ABSTRACT

Provided herein is a xylophone bar magnetometer (XBM) with automatic resonance control, the XBM having a voltage input, a current drive input and a sensor output, having a voltage input switch for switching between a positive drive voltage and a negative drive voltage; a voltage controlled oscillator (VCO) for controlling the voltage input switch; and a feedback loop, connected between the sensor output and a input of the VCO.

10 Claims, 7 Drawing Sheets

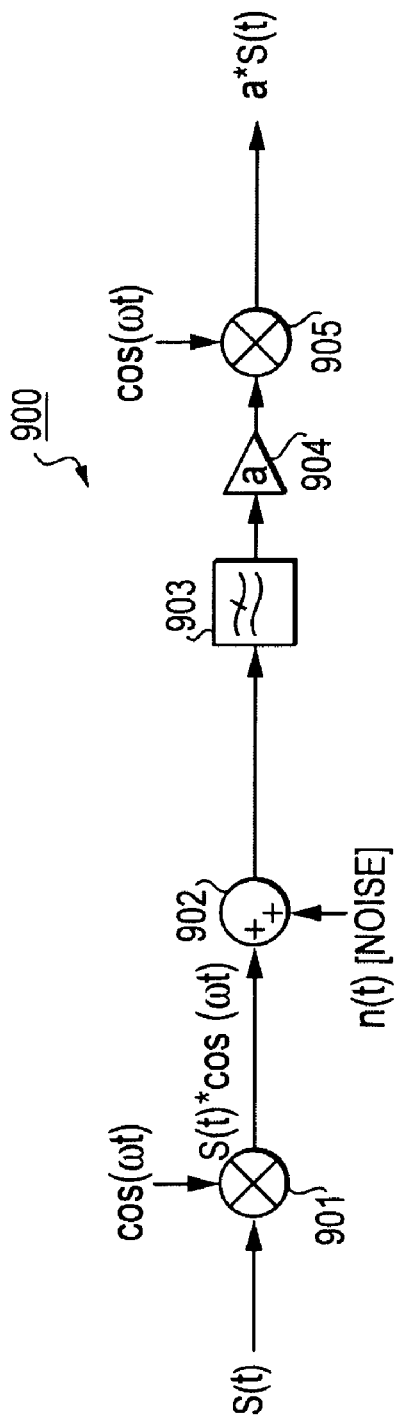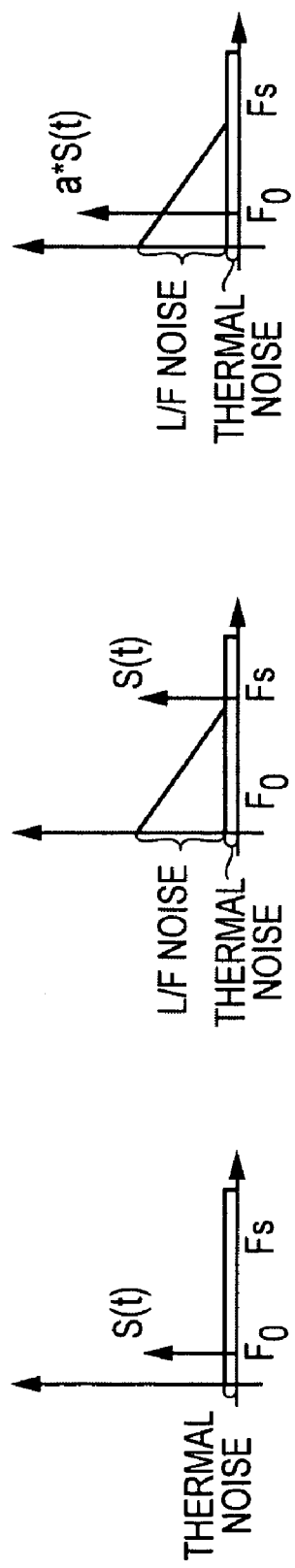
FIG. 9(a)
FIG. 9(b)
FIG. 9(c)
FIG. 9(d)

COMPLEMENTARY METAL-OXIDE SEMICONDUCTOR XYLOPHONE BAR MAGNETOMETER WITH AUTOMATIC RESONANCE CONTROL

CROSS REFERENCE TO RELATED APPLICATIONS

This application claims priority to U.S. Provisional Application No. 60/492,942, filed Aug. 6, 2003, the contents of which are incorporated herein by reference.

BACKGROUND OF THE INVENTION

1. Field of the Invention

The present invention relates generally to a complementary metal-oxide semiconductor (CMOS) xylophone bar magnetometer with automatic resonance control.

2. Description of the Related Art

A Lorentz force-driven mechanical resonator measures the deflection in a conducting bar produced by the Lorentz force as represented by the equation $$F = I \times B \qquad (1)$$

where F is the Lorentz force, I is a current, and B is a magnetic field. FIG. 1 illustrates an embodiment of a Lorentz force-driven mechanical resonator in the form of a xylophone bar magnetometer (XBM) 5, which is described in commonly owned U.S. Pat. No. 5,959,452, issued Sep. 28, 1999, the contents of which are incorporated herein by reference. The XBM 5 is comprised of a resonator 10, in this case a thin conductive bar, e.g., aluminum, supported by two wires 12 and 14. The wires 12 and 14 are bonded to the resonator 10 to provide low-resistance electrical contacts and are positioned at the nodal points expected for a bar free at both ends and vibrating in its fundamental mode.

In operation, alternating currents, generated by a sinusoidal source oscillating at the fundamental transverse resonant mode, are supplied to the resonator 10 at one of two support nodes 16 and extracted at the other node 18, and the device is placed inside a magnetic field. The Lorentz force generated by the current and the applied magnetic field causes the bar to vibrate in its fundamental mode, the vibrational amplitude being proportional to the vector component of the magnetic field parallel to the support wires in the plane of the bar.

The amplitude of the vibration can be measured using various techniques, including optical beam deflection, optical interferometry, and differential capacitance and tunneling currents. The Lorentz force-driven mechanical resonator structure can serve as a fundamental component for numerous RF applications.

FIG. 2 illustrates a Lorentz force-driven mechanical resonator based mixer/filter component 20 that provides a basis for an RF-mixer/filter array design, which is described in commonly owned international application, Ser. No. PCT/US02/13058, filed Apr. 24, 2002 and published under international publication number 02/088764 on Nov. 7, 2002, the contents of which are incorporated herein by reference. A local oscillator (LO) input signal at a frequency $F_{LO}$ drives a pair of magnetic field coils 22 to create a magnetic field (B). In this design, the magnetic field coils 22 are placed lengthwise on either side of Lorentz force-driven mechanical resonator 26. An RF input signal at frequency $f_{ur}$ passes through an impedance matching network 24 and drives an electrical current (I) in the mechanical resonator 26. If the RF frequency is equal to $(F_{LO}+f_0)$ or to $(F_{LO}-f_0)$, where $f_0$ is the resonance frequency of the mechanical resonator 26, then the mechanical resonator 26 begins to resonate. A pair of support arms 28 supports the mechanical resonator 26. The ends of one support arm 28 are coupled with anchor/electrodes 30 that receive the impedance matched RF input signal while the ends of the other support arm 28 are coupled with anchor/electrodes 30 that are grounded. A readout electrode 32 is coupled with the mechanical resonator 26 to provide a Lorentz force output signal (F) for the mixer/filter component 20. In this design, the amplitude of the vibration of the mechanical resonator 26 is determined via direct measurement of capacitance between the bar and an electrode 32 placed near the bar. Other methods or means for determining the amplitude of the vibration of the mechanical resonator 26 may be substituted.

In its implementation as a mixer/filter, a Lorentz force-driven mechanical resonator is a component that can be fashioned into a combined mixer/IF filter for traditional superheterodyne receiver applications, as illustrated in FIG. 2. Because of its high mechanical Q factor, the Lorentz force-driven mechanical resonator can eliminate the multiple conversion stages required in traditional superheterodyne receivers that operate in the UHF to VHF range. To achieve a narrow-IF bandwidth though traditional means, the IF frequency must be relatively low compared to the bandwidth of the signal of interest due to the limitations on the Q factors of electronic devices. For many practical applications, this necessitates the use of multiple IF stages within a receiver system. However, the Lorentz force-driven mechanical resonator allows for high IF frequencies with very high Q values reducing the requirements of the image reject filter while also supplying high compression of interfering signals.

The magnetometer, sensor, and other electronics are manufactured on a single die using a standard CMOS process. The magnetometer, as described above, is a vibrating bar structure with a resonant frequency that is determined by its dimensions and the position of two anchors attached to a CMOS substrate. The Lorentz force causes the bar to vibrate in the presence of a magnetic field vector when an alternating current is present between the anchors of the xylophone (one anchor is a current source, the other is a sink), and the frequency of the current is equal to the resonant frequency of the bar. The magnitude of the vibration is proportional to the magnitude of the magnetic field vector, given a current source with constant amplitude.

A number of conducting fingers protrude from the xylophone bar in the direction perpendicular to the direction of motion. Matching fingers are interdigitated in the static portion of the CMOS die to which the anchors are attached. These interdigitated fingers create a capacitor when the xylophone bar is at rest. As the bar moves in a direction perpendicular to the CMOS substrate, the capacitance formed by these fingers changes from its resting (nominal) value. Exploiting this feature, a capacitive sensor can be used to determine the amount of deflection in the xylophone bar, and hence determine the magnitude of any magnetic field vector that is present.

SUMMARY OF THE INVENTION

In accordance with the present invention, an apparatus for controlling the resonance of a xylophone bar magnetometer is provided.

In one embodiment of the present invention, a resonance control for a xylophone bar magnetometer (XBM) having a stationary part and a vibrational part, the XBM having a voltage input, a current drive input and a sensor output is provided, comprising:

a voltage input switch for switching between a positive drive voltage and a negative drive voltage;

a voltage controlled oscillator (VCO) for controlling the voltage input switch; and a feedback loop, connected between the sensor output and an input of the VCO. Accordingly, it is an object of the present invention to provide a xylophone bar magnetometer (XBM) with automatic resonance control, said XBM having a voltage input, a current drive input and a sensor output, having a voltage input switch for switching between a positive drive voltage and a negative drive voltage; a voltage controlled oscillator (VCO) for controlling the voltage input switch; and a feedback loop, connected between the sensor output and an input of the VCO.

BRIEF DESCRIPTION OF THE DRAWINGS

Various embodiments are described below with reference to the drawings wherein:

FIG. 9(a)–(d) is a schematic diagram of a chopper circuit and representative graphs according to an embodiment of the present invention.

DETAILED DESCRIPTION OF PREFERRED EMBODIMENTS

Figure 1:
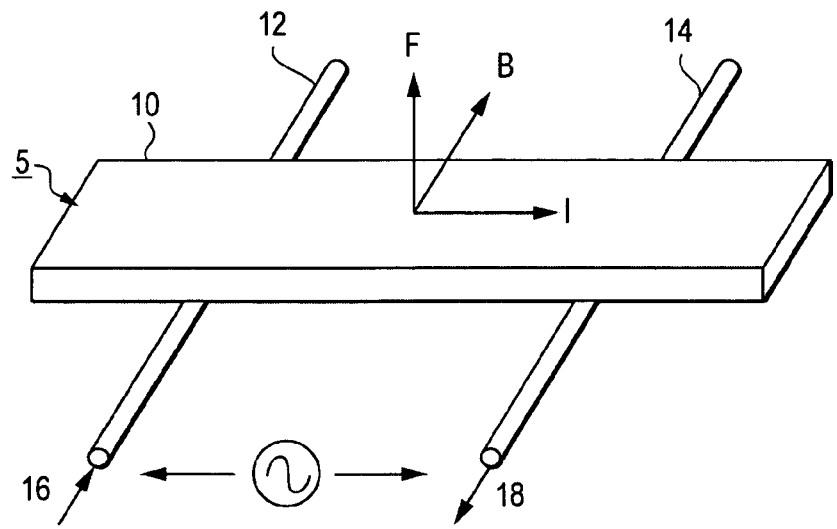
FIG. 1 is a diagram of a Lorentz force-driven mechanical resonator in the form of a xylophone bar magnetometer.
Figure 2:
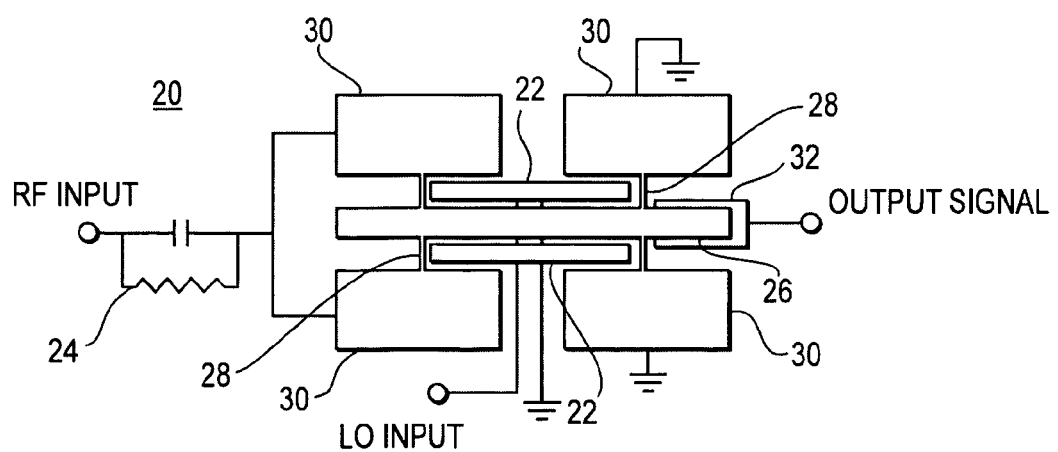
FIG. 2 is a diagram illustrating a Lorentz force-driven mechanical resonator based mixer/filter component.

Preferred embodiments of the present invention will be described herein below with reference to the accompanying drawings, wherein the same components or parts thereof will be represented with the same reference numerals or symbols to avoid any redundancy or repetition, if available. In the following description, well-known functions or constructions are not described in detail since they would obscure the invention in unnecessary detail.

As described above, the xylophone bar magnetometer is a "high-Q" mechanical structure, i.e. is a device that has a high quality factor of approximately 1 e3 in a vacuum. Because of the high Q of the device, the magnetometer is able to detect very small (sub-microTesla) magnetic field vectors. However, the high Q also causes the device to be highly frequency selective. Small deviations in the frequency of the drive current or deviations in the resonant frequency of the device due to temperature gradients or other phenomena will cause the performance of the sensor to degrade severely. One aspect of the present invention overcomes these problems by completing a feedback loop between the sensor output and the current drive circuit as shown in FIG. 3.

Figure 3:
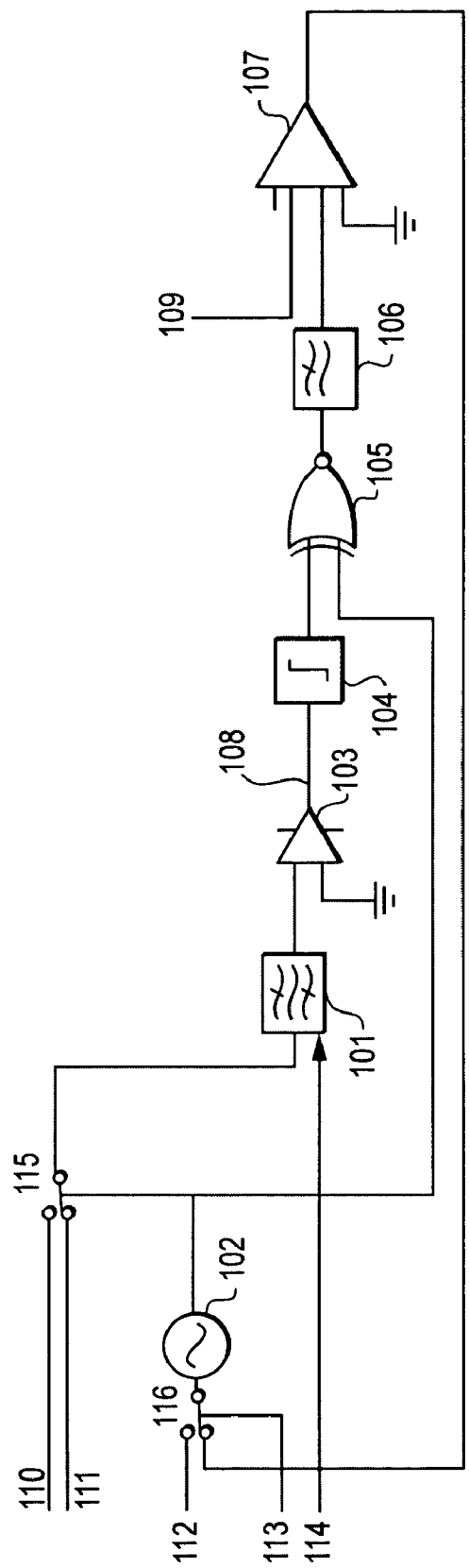
FIG. 3 is a diagram illustrating a resonance frequency control circuit according to an embodiment of the present invention.

FIG. 3 is a diagram illustrating a resonance frequency control circuit according to an embodiment of the present invention. A feedback loop consists of a phase-locked loop design that incorporates an XNOR-gate (exclusive-not-OR gate) phase frequency detector to lock a voltage-controlled oscillator to the resonant frequency of the device. Shown in FIG. 3 are xylophone bar magnetometer (XBM) 101, voltage controlled oscillator 102, capacitive sensor 103, logic converter 104, XNOR gate 105, low pass filter 106, amplifier 107, output voltage point 108, electrostatic phase adjustment input 109, positive supply voltage input 110, negative supply voltage input 111, frequency tuning voltage input 112, automatic tracking command input 113, current input 114, input voltage switch 115, and phase tuning switch 116. The voltage at output voltage input 108 is proportional to the sum of the electrostatic forces and the magnetic (i.e. Lorentz) forces. The novel resonance control circuit can maintain resonance of the XBM without the presence of a magnetic field vector, unlike in the conventional XBM control systems that will lose the resonance when the magnetic field vector is removed. Also, the novel resonance control circuit can quickly regain the resonance of the XBM after the magnetic field vector is removed. A hysteresis phenomenon occurs in the XBM when the electromagnetic forces are removed due to the high Q-factor (approximately 1 e5 in a vacuum) of the XBM. This hysteresis in the gain function is used to maintain the resonance even after the magnetic field vector is removed.

Figure 4A:
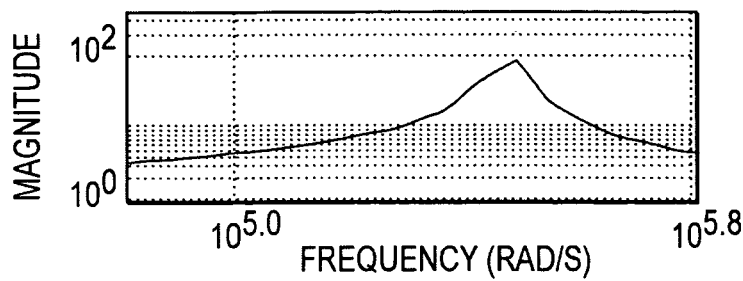
FIG. 4 is a graph illustrating magnitude versus frequency and a graph illustrating phase versus frequency of the deflection of the XBM shown in FIG. 3 according to an embodiment of the present invention.
Figure 4B:
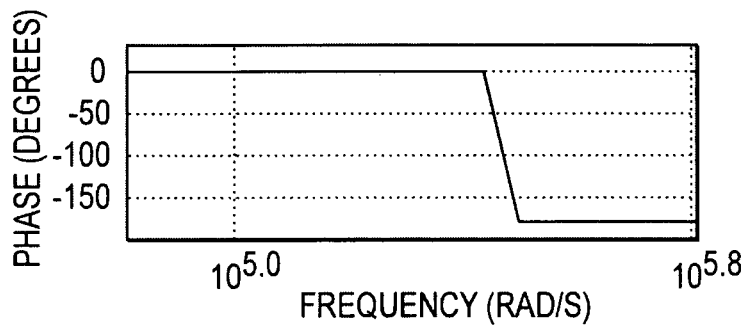

FIG. 4 is a graph illustrating magnitude versus frequency and a graph illustrating phase versus frequency of the deflection of the XBM near the resonance frequency in response to a force according to an embodiment of the present invention. The graphs in FIG. 4 reveal that the maximum deflection of the XBM in response to a driving force occurs at the resonance frequency of the XBM. This point occurs when the phase shift is 90 degrees. The control voltages for the XBM can then be regulated based on the XNOR gate operation which forces a 90 degree phase shift between the signal that acts as the driving force and a signal proportional to the deflection of the XBM.

Figure 5:
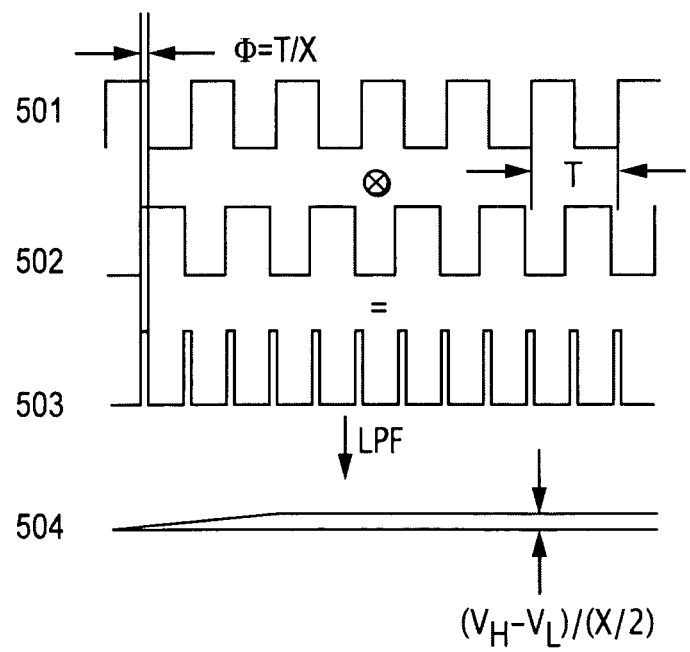
FIG. 5 is a graph comparing various inputs and output of circuit elements of the resonance frequency control circuit of FIG. 3 according to an embodiment of the present invention.

FIG. 5 is a graph comparing various inputs and output of circuit elements of the resonance frequency control circuit according to an embodiment of the present invention. As shown in FIG. 5, signal 501 represents the VCO 102 output signal, signal 502 represents the output signal of the logic converter 104, signal 503 represents the output signal of the XNOR gate 105, and signal 504 represents the output signal of the low pass filter (LPF) 106. VCO signal 501 and logic converter signal 502 are input into the XNOR gate 105. XNOR gate 105 outputs XNOR signal 503, a pulse signal having a width of T/X, where T is the period of the VCO or logic converter signal, and 1/X is the fraction of this time period during which the two signals have the same logic high level. When the XNOR signal 503 is input into the LPF 106, the output LPF signal 504 is achieved. The value of the LPF signal 504 is equal to 1/(X/2) times the difference between the high voltage level ($V_H$) and low voltage level ($V_L$) of XNOR signal 503. As shown in FIG. 4, the DC voltage output of the XNOR gate 105 is midway between the logic high voltage and the logic low voltage when the phase shift is 90 degrees. This produces a VCO control voltage that is high when the phase is less than 90 degrees (i.e. f<f0), and a VCO control voltage that is low when the phase is greater than 90 degrees (i.e. f>f0). By providing external control of the electrostatic forces, the amplitude and phase of the XBM can be maintained. External control of the magnetic forces is controlled by the VCO.

A second problem arises when the magnetic field vector is too small for the XBM to detect. In this case, there is no signal with which to complete the feedback loop and thus match the frequency of the current source to the natural frequency of the XBM. In addition, once resonance is lost, the magnitude of deflection in the xylophone in response to a given Lorentz force degrades by a factor of 1/Q, creating a situation in which a very large magnetic field vector or a very large current is required to create a response at the sensor output. The current required to create a response at the sensor output is limited by the CMOS design rules particular to a given manufacturing process. In other words, the amount of current that can be applied to the xylophone bar is limited to several milliamperes or less by the maximum current density rating of the metal used during the manufacturing process. Thus, the capability to sustain the resonant motion of the xylophone, and hence maintain device sensitivity at a stable value, is lost in the absence of a magnetic field vector, or in the presence of only a very small magnetic field vector.

The sensitivity of the XBM according to an embodiment of the present invention is maintained in the absence of a magnetic field vector with the addition of an electrostatic Micro-Electro-Mechanical Systems (MEMS) actuator. According to the present invention, an electrostatic force is introduced to cause the XBM to vibrate at the resonant frequency. A relatively large electrostatic force can be readily generated using a small voltage. When the XBM is vibrating at the natural frequency using the phase-locked loop feedback, the current drive circuit can then use the feedback signal to create a current source with a frequency that is always the same as the resonant frequency of the XBM. If the Lorentz force and electrostatic force contributions on the XBM are added in-phase, the output of the sensor is proportional to the sum of the electromagnetic (Lorentz) and electrostatic forces.

The present invention uses the MEMS properties of the XBM to compensate for the magnetic fields that are absent or too small for the XBM to detect. A capacitance sensing circuit that incorporates the MEMS theory is used to monitor the capacitance of the XBM in order to maintain resonance.

Figure 6:
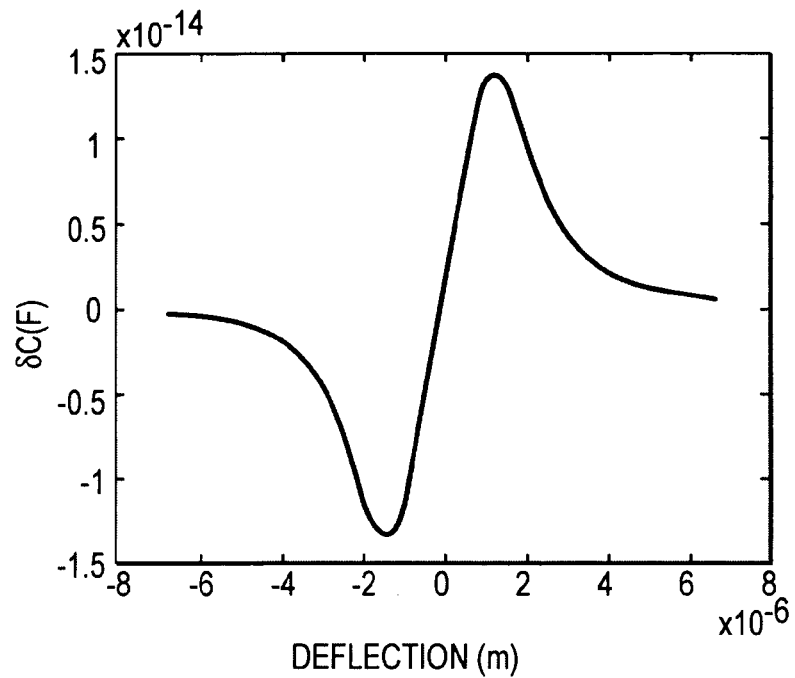
FIG. 6 is a graph illustrating the relation between the capacitance of the XBM versus the deflection of the XBM.

FIG. 6 is a graph illustrating the relation between the capacitance of the XBM versus the deflection of the XBM. As can be seen in FIG. 6, the capacitance in Farads of the XBM is shown on the y-axis and the deflection in meters in shown on the x-axis. As the XBM resonates (or is deflected), the capacitance varies and can be measured to determine the amount of deflection. This deflection information can be used to monitor the XBM to determine when the amount of deflection is reaching its low critical value whereat the XBM will cease to resonate, and then an external force can be applied to the XBM to maintain resonance.

Figures 7A, 7B:
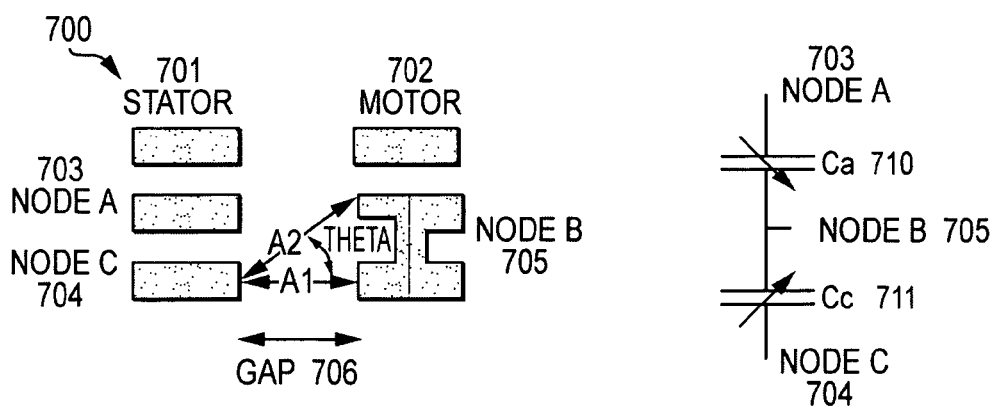
FIGS. 7(a) and (b) is a diagram illustrating a MEMS motor and a schematic diagram of the MEMS motor.

FIG. 7 is a diagram illustrating the XBM as a MEMS motor and a schematic diagram of the XBM MEMS motor. As described earlier, a number of conducting fingers protrude from the xylophone bar in the direction perpendicular to the direction of motion. Matching fingers are interdigitated in the static portion of the CMOS die to which the anchors are attached. These interdigitated fingers create a capacitor when the xylophone bar is at rest. As the bar moves in a direction perpendicular to the CMOS substrate, the capacitance formed by these fingers changes from its resting (nominal) value. Exploiting this feature, a capacitive sensor can be used to determine the amount of deflection in the xylophone bar, and hence determine the magnitude of any magnetic field vectors that are present. Shown in diagram (a) of FIG. 7 are stator 701 and motor 702 that comprise MEMS motor 700. The stator 701 is the stationary part of the XBM, and the motor 707 is the vibrational part of the XBM. Also shown in diagram (a) of FIG. 7 are Node A 703, Node C 704, and Node B 705, and gap 706. Diagram (b) of FIG. 7 also shows Node A 703, Node C 704, and Node B 705, and includes the variable capacitances Ca 710 and Cc 711. Variable capacitance Ca 710 is the capacitance that occurs between Node A 703 and Node B 705, and variable capacitance Cc 711 is the capacitance that occurs between Node C 704 and Node B 705. A first order estimation of the capacitance of the MEMS device can be given by the capacitance equation $$C = \epsilon A/d \qquad (2)$$

wherein C is the capacitance, $\epsilon$ is the relative permittivity, A is the area of the plates (i.e. the stator 701 and the motor 702), and d is the distance of the gap 706.

Figure 8:
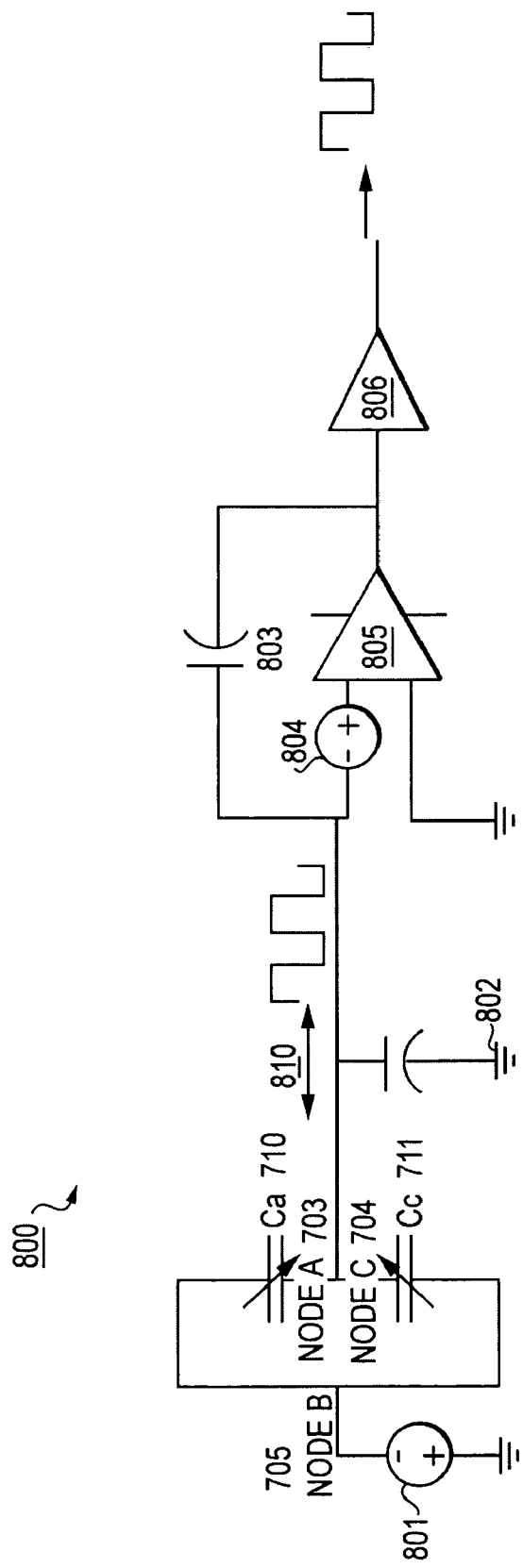
FIG. 8 is a schematic diagram of the capacitance sensing circuit according to an embodiment of the present invention.

FIG. 8 is a schematic diagram of the capacitance sensing circuit according to an embodiment of the present invention. Shown in FIG. 8 are Nodes A, B, and C (703, 704, and 705, respectively) and Ca 710 and Cc 711, all of the XBM MEMS device. Also shown in FIG. 8 are input voltage (Vin) 801, capacitor 802, feed back capacitor (Cfb) 803, error voltage (Verr) 804, amplifier 805 and pre-amplifier (pre-amp) 806. The capacitance sensing circuit 800 of FIG. 8 uses a capacitive half-bridge detection to sense the capacitance change in the XBM. A voltage is applied to the XBM and the difference in capacitive charge is measured. The output voltage Vout of the capacitance sensing circuit 800, measured at the output of the preamp 806 is given by $$Vout = Vin[(Ca-Cc)/Cfb] + Verr \qquad (4).$$

By monitoring the capacitance and therefore the deflection, the XBM can be monitored, and when reaching its critical minimum deflection, i.e. minimum resonance or vibration, where a restart of the XBM would be required, the XBM vibration can be maintained by the input of an external force.

Low-noise performance for the capacitive sensor circuit is achieved using a chopper stabilization amplifier architecture. FIG. 9 is a schematic diagram of a chopper circuit and representative graphs according to an embodiment of the present invention. The chopper stabilization circuit 900 shown in diagram (a) of FIG. 9 is comprised of multipliers 901 and 905, adder 902, high pass filter 903 and amplifier 904. The graphs labeled as diagrams (b), (c) and (d) represent signals at different points of the chopper stabilization circuit 900 of diagram (a) of FIG. 9. Signal S(t) is input into multiplier 901. Input signal S(t) is shown in diagram (b) at $f_0$. The input signal S(t) is multiplied in multiplier 901 by $\cos(\omega t)$ to produce $S(t)*\cos(\omega t)$. This signal is input into adder 902 where it is added to 1/f noise or 'flicker' noise n(t). Diagram (c) shows the signal output from the adder 902, where the 1/f noise is shown dominating the signal at low frequencies, and the input signal S(t) has been shifted to $f_S$. The output signal from the adder 902 is input into the high pass filter 903 where it is filtered, and high pass filter 903 outputs the low pass filtered signal to be amplified by amplifier 904. The amplified signal is input into multiplier 905 where it is again multiplied by $\cos(\omega t)$ to produce amplified signal a*S(t). Diagram (d) shows that the signal has now been shifted back to $f_0$ but at this point the signal a*S(t) is not dominated by the noise.

Figure 10:
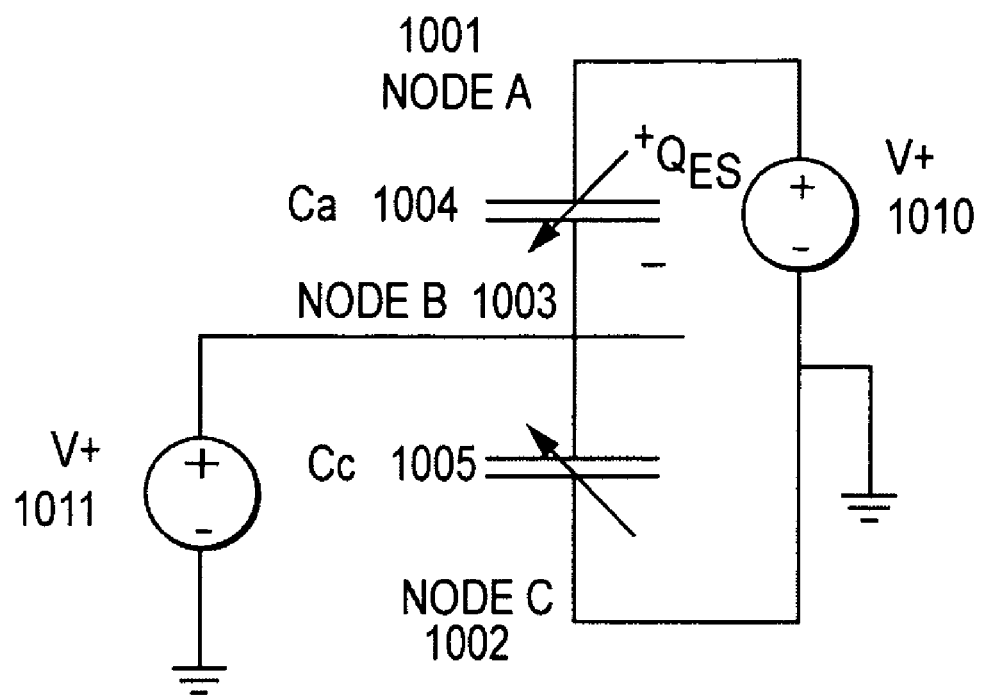
FIG. 10 is a diagram illustrating a electrostatic actuator according to an embodiment of the present invention.

FIG. 10 is a diagram illustrating a electrostatic actuator according to an embodiment of the present invention. Shown in FIG. 10 are MEMS Motor Node A 1001, MEMS Motor Node B 1003, MEMS Motor Node C 1002, Ca 1004, Cc 1005, voltage source 1010, and voltage source 1011. If identical drive voltages, V, are applied to 1003 and 1001 while 1002 is held at ground potential, then the electrostatic attractive force, $F_{ES}$, (in Newtons) between Nodes 1003 and 1002 is equal to $$|F_{ES}|=Q^2/2\epsilon A \quad (5)$$

wherein Q is the charge held in capacitor Cc. The charge of Cc ($Q_{ES}$) is given by $$Q_{ES}=V*CC \quad (6).$$

The complementary metal-oxide semiconductor xylophone bar magnetometer with automatic resonance control according to an embodiment of the present invention differs in one way from other MEMS-based magnetometer designs in that a combination of electrostatic and electromagnetic actuations are used in the operation of the device. Other MEMS-based sensor designs may incorporate a coil drive that is used create a magnetic field vector, forcing a deflection in the MEMS device even in the absence of external magnetic field vectors.

The present invention is ideal for incorporation into low-cost precision magnetometers and compasses, and MEMS-based inertial navigation systems (when integrated with CMOS/MEMS accelerometers and gyroscopes), as compared with conventional giant magneto-resistive and Hall effect sensors that do not have anticipated sensitivities and are not easily integrated into existing systems.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A resonance control for a xylophone bar magnetometer (XBM) having a stationary part and a vibrational part, said XBM having a voltage input, a current drive input and a sensor output, comprising:
   a voltage input switch for switching between a positive drive voltage and a negative drive voltage;
   a voltage controlled oscillator (VCO) for controlling the voltage input switch; and
   a feedback loop, connected between the sensor output and an input of the VCO.

2. The resonance control for the xylophone bar magnetometer (XBM) of claim 1, wherein the feedback loop comprises:
   an exclusive-not-OR (XNOR) gate for receiving a signal from the sensor output and a signal output from the VCO, and outputting a pulse signal; and
   a low pass filter for receiving the pulse signal and outputting a constant voltage for use as a control signal supplied to the input of the VCO.

3. The resonance control for the xylophone bar magnetometer (XBM) of claim 2, wherein the feedback loop further comprises a logic conversion unit connected between the sensor output and the XNOR gate.

4. The resonance control for the xylophone bar magnetometer (XBM) of claim 3, wherein the feedback loop further comprises a capacitive sensor connected between the XBM and the logic converter for sensing the capacitance of the XBM, said capacitance produced between the stationary part and the vibrational part of the XBM.

5. The resonance control for the xylophone bar magnetometer (XBM) of claim 3, wherein the feedback loop further comprises an amplifier connected between the low pass filter and input of the VCO.

6. The resonance control for the xylophone bar magnetometer (XBM) of claim 4, wherein the capacitance sensor comprises:
   a voltage input for receiving a voltage into the vibrational part of the XBM; and
   a means for measuring the change in capacitance from before the voltage is applied to the XBM and after the voltage is applied.

7. The resonance control for the xylophone bar magnetometer (XBM) of claim 1, further comprising a chopper stabilization circuit for low-noise performance.

8. The resonance control for the xylophone bar magnetometer (XBM) of claim 7, wherein the chopper stabilization circuit comprises:
   a first multiplier for multiplying an input signal by a frequency shifting signal for shifting the frequency of the input signal;
   a high pass filter for high-pass filtering undesired noise signals, said high pass filter filtering signals below the frequency of the frequency-shifted input signal;
   an amplifier for amplifying the frequency-shifted input signal; and
   a second multiplier for multiplying the amplified frequency-shifted input signal by a second frequency shifting signal for shifting the amplified frequency-shifted input signal back to its original frequency.

9. The resonance control for the xylophone bar magnetometer (XBM) of claim 1, further comprising an electrostatic actuator for providing an electrostatic force to the XBM for maintaining resonance.

10. The resonance control for the xylophone bar magnetometer (XBM) of claim 9, wherein the stationary part of the XBM has multiple fingers, and the electrostatic actuator comprises:
   a first voltage source for inputting a first voltage into the vibrational part of the XBM; and
   a second voltage source for applying a voltage between a first finger of the stationary part of the XBM and a second finger of the stationary part of the XBM.

* * * * *